United States Patent
Bradley et al.

(10) Patent No.: US 6,917,892 B2
(45) Date of Patent: Jul. 12, 2005

(54) SINGLE PORT SINGLE CONNECTION VNA CALIBRATION APPARATUS

(75) Inventors: Donald Anthony Bradley, Morgan Hill, CA (US); Kirby Garyen Hong, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 10/244,291

(22) Filed: Sep. 16, 2002

(65) Prior Publication Data

US 2004/0054490 A1 Mar. 18, 2004

(51) Int. Cl.[7] .............................................. G06F 19/00
(52) U.S. Cl. ........................................................ 702/107
(58) Field of Search .......................... 702/107, 57, 118, 702/85, 64, 66, 91, 109, 77; 435/7, 6, 7.1; 324/600, 601, 638, 76, 765; 257/783; 436/318, 501, 536; 424/601; 455/67; 342/22, 368; 398/182

(56) References Cited

U.S. PATENT DOCUMENTS 5,327,139 A * 7/1994 Johnson ........................ 342/22
5,548,221 A * 8/1996 Adamian et al. ............ 324/601

2003/0032067 A1 * 2/2003 Hefti ............................ 435/7.9

OTHER PUBLICATIONS

Ballo, D., Network Analyzer Basics, 1998 Back to Basics Seminar, Hewlett–Packard Company.

* cited by examiner

Primary Examiner—John Barlow
Assistant Examiner—Tung Lau
(74) Attorney, Agent, or Firm—Fliesler & Meyer LLP

(57) ABSTRACT

A method and apparatus are used to calibration a Vector Network Analyzer (VNA). The method includes providing a calibration module with a single port, providing within the calibration module a set of reflecting components with known scattering parameters, providing control signals to the calibration module through the single port, providing the known scattering parameters to the VNA through the single port, coupling one of reflecting components to the VNA, measuring scattering parameters, and comparing the measured scattering parameters with the known scattering parameters. The apparatus includes a calibration module and a controller module. In one embodiment, the calibration module includes a set of reflecting components, a memory that stores the characterization data, and a current source which sends characterization data in the form of current pulses to the controller module. The controller module includes a voltage source that generates the control signals used by the calibration module.

30 Claims, 11 Drawing Sheets

SINGLE PORT SINGLE CONNECTION VNA CALIBRATION APPARATUS

BACKGROUND OF THE INVENTION

1. Field of the Invention

The present invention relates to calibration of vector network analyzers in general and in particular to a single port, single connection calibration apparatus.

2. Description of the Related Art

Measurement errors in any vector network analyzer (VNA) contribute to the uncertainty of the device being measured by the VNA. By quantifying these errors, their effects can be drastically reduced. Measurement errors in network analysis can be separated into two categories: random errors and systematic errors. Random errors are non-repeatable measurement variations due to physical change (e.g., noise and temperature changes) and, therefore, are usually unpredictable. Systematic errors are repeatable measurement variations in the test setup itself (e.g., directivity, source match, frequency response, and leakage).

In most measurements made on "devices under test" (DUT) with a VNA, the systematic errors are the most significant source of measurement uncertainty. Therefore, it is desirable to remove these errors from the VNA measurements. This is achieved through a VNA calibration.

The traditional calibration method requires an operator to press a sequence of buttons on a VNA and manually connect and remove at lease three "perfect" calibration components. The VNA measures each component and transfers the accuracy of the standards to the VNA. This calibration process is time-consuming and prone to operator error.

In contrast, an automatic calibration device is useful because it reduces calibration time and reduces the chance of operator error. A prior art automatic calibration device for a one-port VNA is depicted in FIG. 1. The automatic calibration device 116 shown in FIG. 1 requires an operator to connect the calibration device 116 to a test port 104 of the VNA 102 and press a button. The calibration device 116 then automatically calibrates the VNA by connecting the calibration components 120, 122, and 124 to test port 106 through switch 118. The calibration device 116 does not require "perfect" calibration components. Imperfect calibration components 120, 122 and 124 can be used as long as their characteristics (S-parameters) are repeatable and accurately measured. These S-parameters are stored for use by the VNA 102. During calibration, the VNA 102 measures the three calibration components 120, 122 and 124, and these measurement results and the previously stored S-parameter data are used to calculate correction factors. Calibration component 126 is used for verifying the accuracy of the VNA after it has been calibrated.

With the automatic calibration device depicted in FIG. 1, two types of communication are performed between the calibration device 116 and the VNA 102. The first type of communication includes the transmission of digital control signals between the calibration device and the controller 128, while the second type of communication includes the transmission and reception of microwave/radio (RF) signals between the calibration device and the VNA. Thus, communication between the calibration device 116 and the VNA 102 requires at least two ports on both the calibration device and the VNA, along with two separate cables. A first cable 114 carries the digital control signals between a first set of ports (108, 110), while a second cable 112 carries the RF signals through a second set of ports (104, 106). In addition, the calibration device 116 requires an external power supply.

Accordingly, it is an object of the present invention to provide a method and apparatus for calibrating a VNA that requires only one cable and one set of ports for communication between an automatic calibration device and the VNA. It is a further object of the present invention that the calibration device draw its power from the single cable.

SUMMARY OF THE INVENTION

In accordance with the present invention, an apparatus and method for calibrating a VNA are provided. The method in accordance with the present invention includes the steps of providing a calibration module with a single port, providing within the calibration module a set of reflecting components with known scattering parameters, providing control signals to the calibration module through the single port, providing the known scattering parameters to the VNA through the single port, coupling one of reflecting components to the VNA, measuring scattering parameters, comparing the measured scattering parameters with the known scattering parameters, and determining calibration values which can be utilized to correct errors introduced by the VNA. The reflecting components include a short, an open and a low reflection impedance. The VNA transmits control signals to the calibration module by transmitting at least three voltage levels to the calibration module. The calibration module transmits the known scattering parameters to the VNA by transmitting current pulses to the VNA.

One implementation of an apparatus to calibrate a VNA using the method described includes a calibration module and a controller module. The calibration module includes a set of reflecting components and a switch for connecting the reflecting components. The switch is controlled by control signals received from the controller module. The calibration module further includes a memory for storing the known scattering parameters for the reflecting components and a microcontroller coupled to the memory. In alternate embodiments, the memory can also store the date when the scattering parameters for the reflecting components were stored and the ambient temperature at which the scattering parameters were stored. The microcontroller is controlled by the control signals received from the controller module. Also included in the calibration module is a current source coupled to the microcontroller, wherein the current source provides current pulses to the controller module under direction of the microcontroller. The controller module includes a processor, a voltage source coupled to the processor, wherein the voltage source, under direction of the processor, generates the control signals used by the calibration module. The controller module further includes a convertor coupled to the processor, wherein the convertor receives the current pulses from the current source of the calibration module, and wherein the convertor converts the current pulses into voltage levels to be used by the processor.

BRIEF DESCRIPTION OF THE DRAWINGS

Details of the present invention will appear more clearly from the following description in which the preferred embodiment of the invention has been set forth in conjunction with the drawings in which.

DETAILED DESCRIPTION

Figure 1:
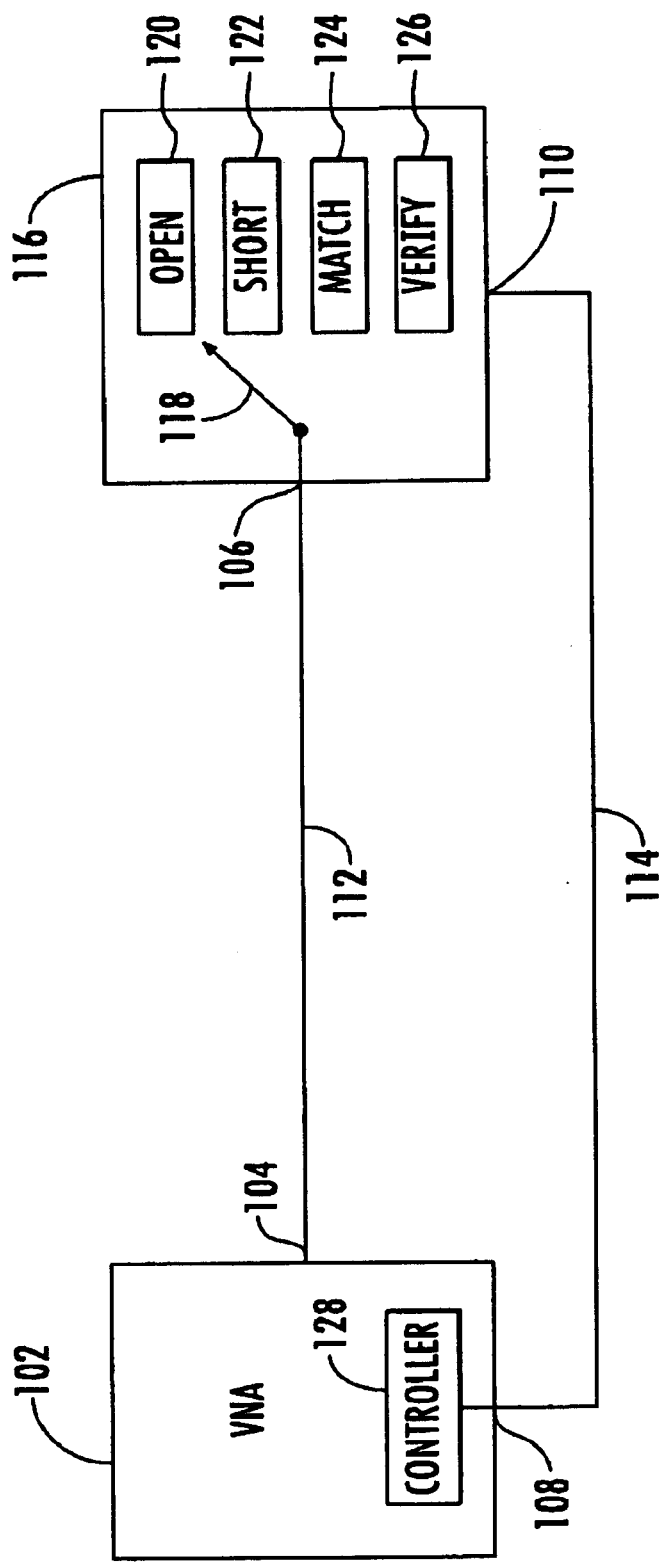
FIG. 1 is a block diagram depicting a prior art automatic VNA calibration device.
Figure 2:
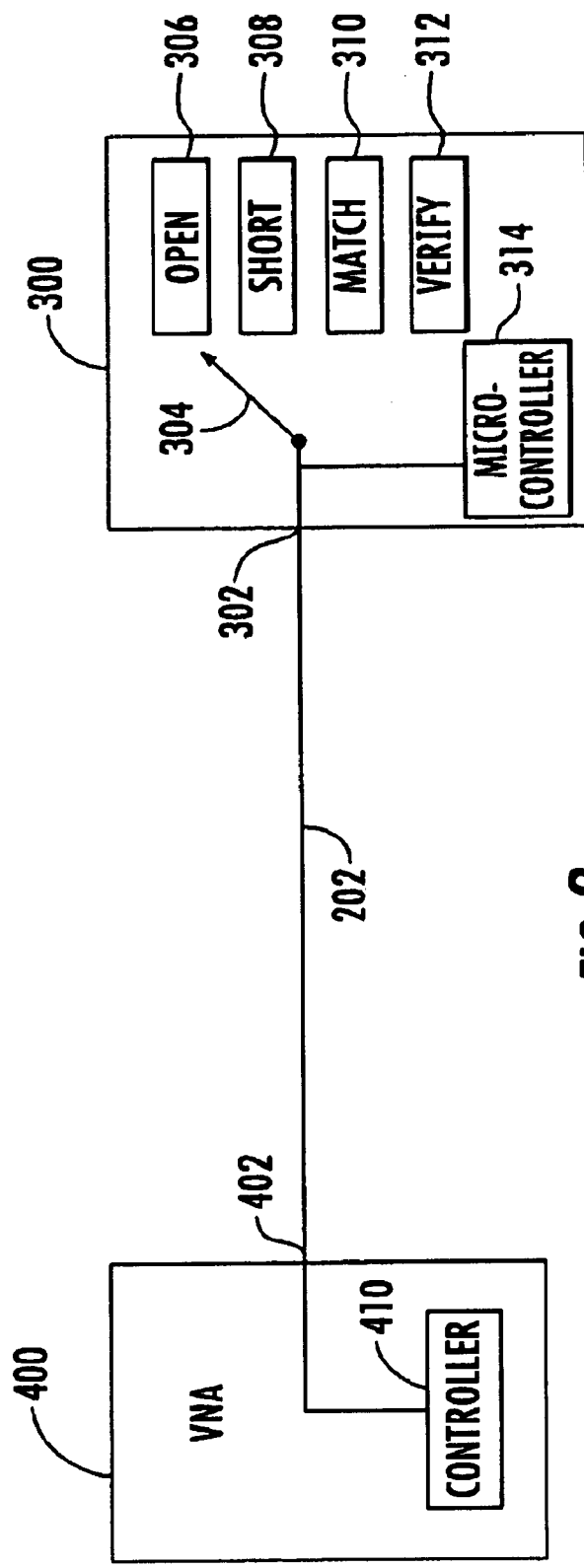
FIG. 2 is a block diagram of a VNA calibration apparatus in accordance with the present invention.

FIG. 2 depicts a general overview of a VNA calibration apparatus in accordance with the present invention. As shown in FIG. 2, VNA 400 and calibration module 300 communicate through a single RF line 202, which couples RF port 402 with RF port 302. RF line 202 carries control signals from VNA 400 to calibration module 300, and carries data from calibration module 300 to VNA 400. Controller module 410, which in one embodiment is housed inside VNA 400, is connected to RF port 402. Switch assembly 304 couples the reflecting components 306, 308, 310, and 312 to RF port 302.

The manner of communication between VNA 400 and calibration module 300 will now be discussed. Controller module 410 transmits control signals to calibration module 300 through RF line 202. These control signals control the position of switch assembly 304 and the functions of microcontroller 314. Controller module 410 controls the operation of switch assembly 304 by placing four distinct DC voltage levels on RF line 202. Each voltage level causes switch assembly 304 to connect one of the reflecting components 306, 308, and 310, or verification component 312, to RF port 302. Controller module 410 controls the functions of microcontroller 314 by toggling between two DC voltage levels on RF line 202. Calibration module 300 senses the edges of the pulses and converts the edges into logic level signals for use by microcontroller 314.

Calibration module 300 transmits stored characterization data (S-parameters) for the reflecting components to VNA 400 by varying the current on RF line 202. VNA 400 senses the current on RF line 202 and converts the current pulses into logic level signals for use by the VNA's microprocessor (not shown in FIG. 2). Additionally, calibration module 300 is powered by DC voltage transmitted through RF line 202.

Figure 3:
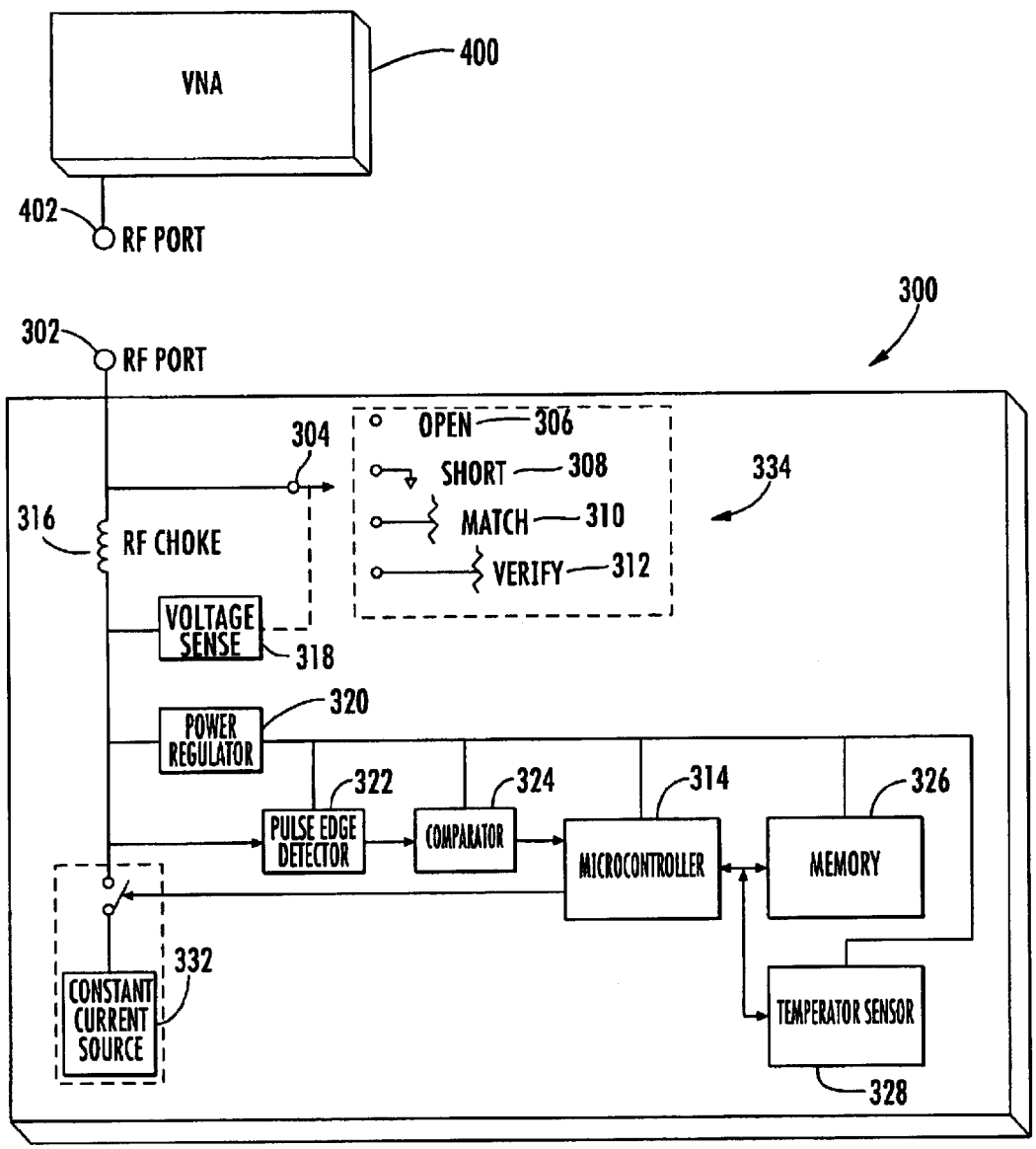
FIG. 3 is a block diagram of a calibration module in accordance with the present invention.

FIG. 3 is a block diagram depicting details of calibration module 300. RF port 302 of calibration module 300 is connected to RF port 402 of VNA4 00. Calibration module 300 includes switch assembly 304 having at least four positions for coupling reflecting components 306, 308, and 310, and verifying component 312, to RF port 302. (The reflecting components are referred to collectively with reference number 334.) In general, while more than three reflecting components could be used for calibration, only three are necessary so long as their respective S-parameters are known and sufficiently distinct from each other.

Switch assembly 304 is controlled by voltage sense 318. Voltage sense 318, along with the remaining components of calibration module 300, receive DC signals from RF port 302 through RF choke 316. RF choke 316 isolates microwave/RF signals from voltage sense 318. Voltage sense 318 senses the four voltage levels sent as control signals through RF port 302 and causes switch assembly 304 to make the appropriate connections based upon these voltage levels.

Power regulator 320 provides a constant 5V DC power source for various components of calibration module 300, including pulse edge detector 322, comparator 324, microcontroller 314, memory 326, and temperature sensor 328. The DC power is drawn directly from the DC voltage on RF port 302.

Memory 326 stores characterization data for the reflecting components. This information is recalled and transmitted to VNA 400 under the direction of microcontroller 314. Microcontroller 314, in turn, operates under the direction of control signals received from controller module 410 through RF port 302. Controller module 410 transmits these control signals by toggling RF port 302 between two DC voltage levels. Pulse edge detector 322 senses the edges of the pulses, while comparator 324 converts the edges into logic level signals for use by microcontroller 314. In an alternate embodiment, the memory 326 can also store a date when the scattering parameters for the reflecting components were stored and the ambient temperature at which the scattering parameters were stored in memory 326. The storage date and temperature can be accessed to determine the when the module's reflecting components were last characterized. In one embodiment, the module's reflecting components are re-characterized on an annual basis to mitigate the effects of aging. However, in alternate embodiments the module's reflecting components can be re-characterized more or less frequently.

Calibration module 300 transmits the stored characterization data to VNA 400 by varying the current on RF port 302. This varied current is generated by constant current source 332. The operation of constant current source 332 is controlled by microcontroller 314. Calibration module 300 optionally contains a temperature sensor 328. Because characterization data can be affected by temperature, temperature sensor 328 provides the ability to measure the temperature at the time the reflecting components are characterized. This temperature is stored in memory 326 for future reference.

Figure 4:
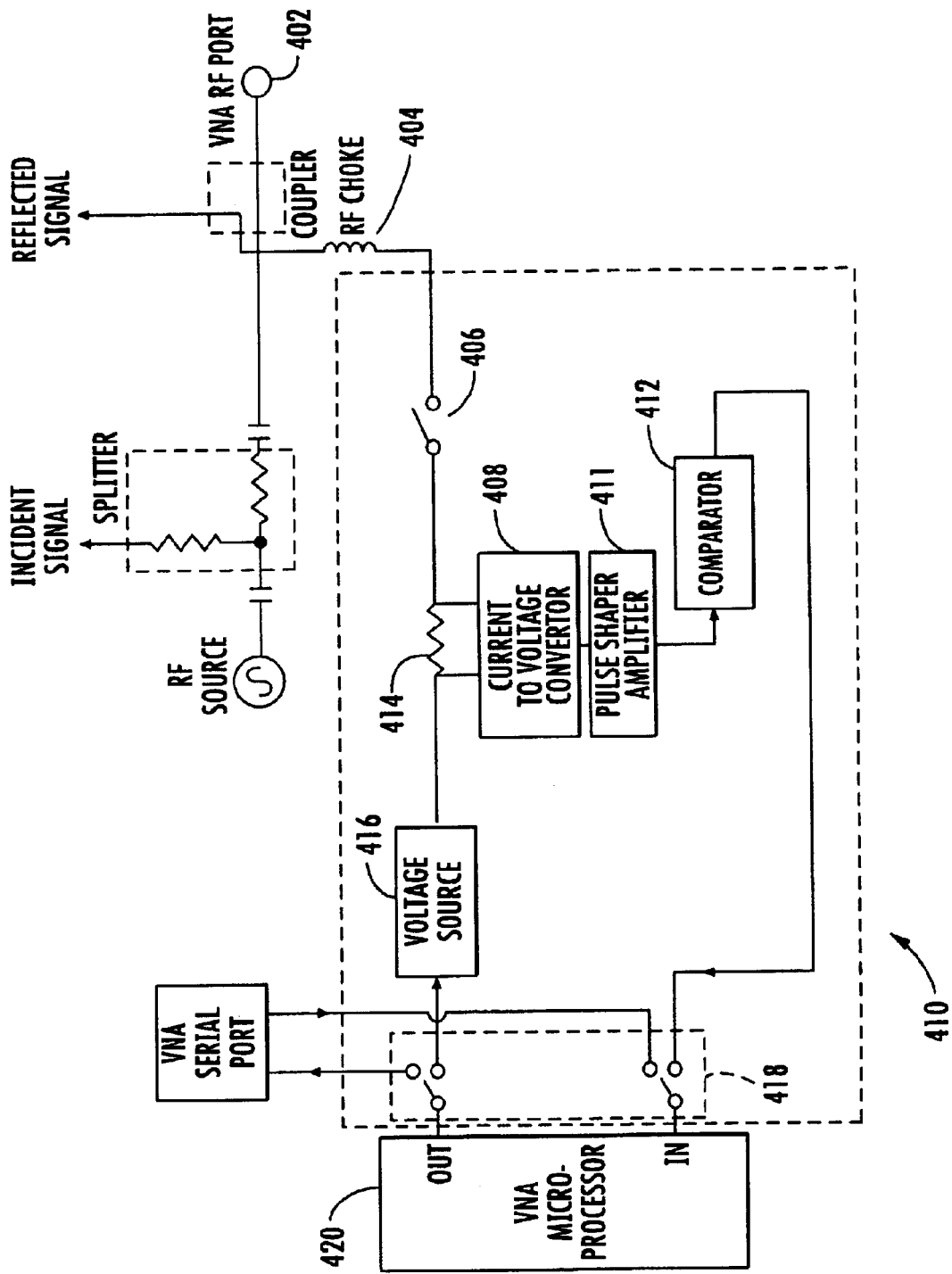
FIG. 4 is a block diagram of a controller module in accordance with the present invention.

FIG. 4 is a block diagram depicting details of controller module 410. Controller module 410 is coupled to the VNA microprocessor 420 through switch assembly 418. When controller module 410 is not in use, microprocessor 420 is coupled to the VNA's serial port. Controller module 410 receives DC signals from RF port 402 through RF choke 404. RF choke 404 ensures that RF signals do not enter into the controller module. DC relay 406 couples RF choke 404 to the remainder of controller 410.

Voltage source 416, under the direction of microprocessor 420, provides the DC voltage levels that operate as control signals for calibration module 300. As explained above, controller module 410 controls switch assembly 304 by placing four distinct voltage levels on RF port 402, and controls microcontroller 314 by toggling between two voltage levels on RF port 402. Additionally, controller module 410 receives characterization data from calibration module 300 through RF port 402. As explained above, calibration module 300 transmits the characterization data by varying the current on RF port 402. Current to voltage convertor 408 measures the current levels by measuring the voltage across resistor 414, and converts these current levels into voltage levels. Pulse shaper amplifier 411 and comparator 412 then convert these voltage levels into logic level signals that can be used by VNA microprocessor 420.

Calibration Module

Figure 5:
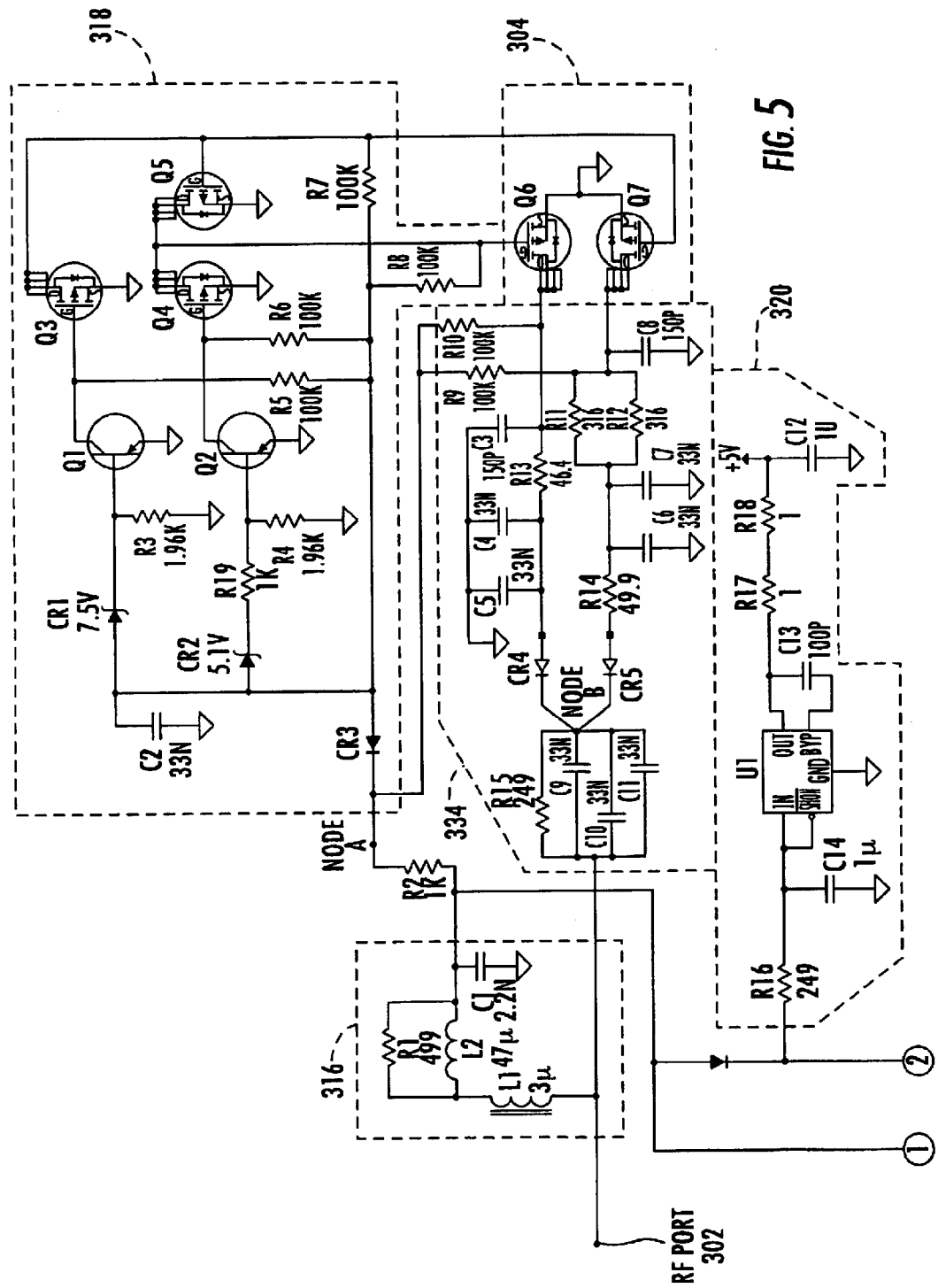
FIG. 5 is a schematic diagram of a portion of a calibration module in accordance with the present invention.
Figure 6A:
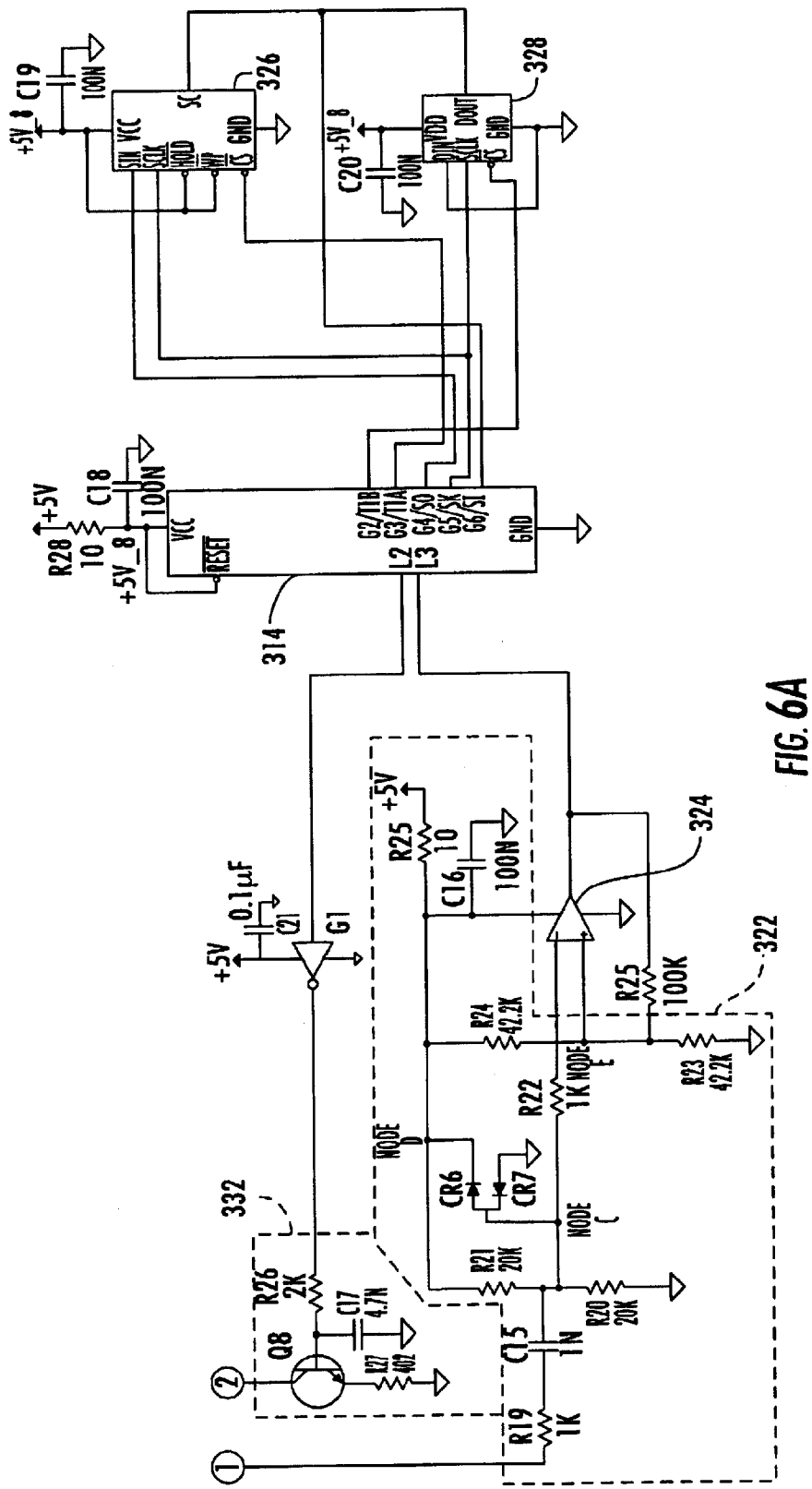
FIG. 6A is a schematic diagram of a portion of a calibration module in accordance with the present invention.

Further details of calibration module 300 will now be discussed. FIGS. 5 and 6 together provide a schematic diagram of one embodiment of calibration module 300 in accordance with the present invention. FIG. 5 depicts RF choke 316, switch assembly 304, voltage sense 318, and reflecting component 334. FIG. 6A depicts pulse edge detector 322, comparator 324, microcontroller 314, memory 326, temperature sensor 328 and constant current source 332. FIGS. 5 and 6A are connected at points "1" and "2." Each component depicted the accompanying figures is labeled with an example component value. Resistor values are represented in ohms, capacitor values in farads, and inductor values in henries, wherein "K" represents kilo-, "U" represents micro-, and "N" represents nano-. It should be noted that several components in the figures (e.g., resistors and capacitors) can be combined into a single component of equivalent value.

With reference to FIG. 5, voltage sense 318 senses the four DC voltage levels sent as control signals through RF port 302 and causes switch assembly 304 to make the appropriate connections based upon these voltage levels. In one embodiment, a voltage level greater than −7.1V connects RF port 302 to an "open" component, a voltage between −7.1V and −11.6V connects RF port 302 to a "short," and a voltage less than −11.6V connects RF port 302 to a "match." Voltage sense 318 receives these DC voltage levels through RF choke 3.6.

The operation of voltage sense 318, switch assembly 304 and reflecting component 334 will now be discussed in the context of switching to an "open" component. Controller module 410 places a DC voltage level greater than −7.1V on RF port 302 (+9V in this example). This potential on Node B turns off diodes CR3, CR4 and CR5, causing reflecting component 334 to behave like an open circuit.

The operation of voltage sense 318, switch assembly 304 and reflecting component 334 will now be discussed in the context of switching to a "short" component. Controller module 410 places a DC voltage level between −7.1V and −11.6V on RF port 302 (−10V in this example). A voltage of −10V on RF port 302 drives diodes CR2 and CR3, and the gates of transistors Q2–Q7. With transistor Q2 turned on, the potential on the gate of transistor Q4 is lowered to ground, thus turning off transistor Q4. The potential on the gates of transistors Q5 and Q7 is also lowered to ground through Q3, turning off transistor Q5 and Q7. With transistors Q4 and Q5 both turned off, a negative potential remains on the gate of transistor Q6, turning on transistor Q6 and providing a DC connection to ground for diode CR4. Together with the negative potential applied to Node B, such a configuration turns on diode CR4 and turns off diode CR5. With CR4 on, the capacitors C4 and C5 provide a low impedance path to ground for RF signals at the test port. Hence, reflecting component 334 behaves like an short circuit.

Lastly, the operation of voltage sense 318, switch assembly 304 and reflecting component 334 will now be discussed in the context of switching to a "match" (or "load") component. Controller module 410 places a DC voltage less than −11.6V on RF port 302 (−15V in this example). A voltage of −15V on RF port 302 drives diodes CR1, CR2 and CR3, and the gates of transistors Q1–Q7. With transistors Q1 and Q2 turned on, the potential on the gates of transistors Q3 and Q4 is lowered to ground, turning off transistors Q3 and Q4. Transistors Q5 and Q7 remain on because their gate potential remains negative. With transistor Q5 turned on, the gate potential of transistor Q6 is lowered to ground, turning off transistor Q6. Together with the negative potential applied to Node B, such a configuration turns on diode CR5 and turns off diode CR4. With CR5 on, capacitors C6 and C7 and resistor R14 provide a nearly resistive impedance to ground for RF signals at the test port. Thus, reflecting component 334 behaves like a "match" or "load."

FIG. 5 also comprises power regulator 320. Power regulator 320 receives DC voltage from RF port 302 through RF choke 316, and provides a constant 5V voltage source for various components of calibration module 300, including pulse edge detector 322, comparator 324, microcontroller 314, memory 326, and temperature sensor 328. Power regulator 320 comprises component U1 which converts an input voltage into a 5V output voltage. In one embodiment, component U1 comprises Linear Technology part no. LT1761ES5.

Attention is now drawn to FIG. 6A. As discussed above, microcontroller 314 operates under the direction of control signals received from controller module 410 through RF port 302. Controller module 410 transmits these control signals by toggling RF port 302 between two DC voltage levels. In one embodiment, RF port 302 is toggled between 9V and 11V. Pulse edge detector 322 senses the edges of the pulses, while comparator 324 converts the edges into logic level signals (0V to 5V) for use by microcontroller 314.

Figure 6B:
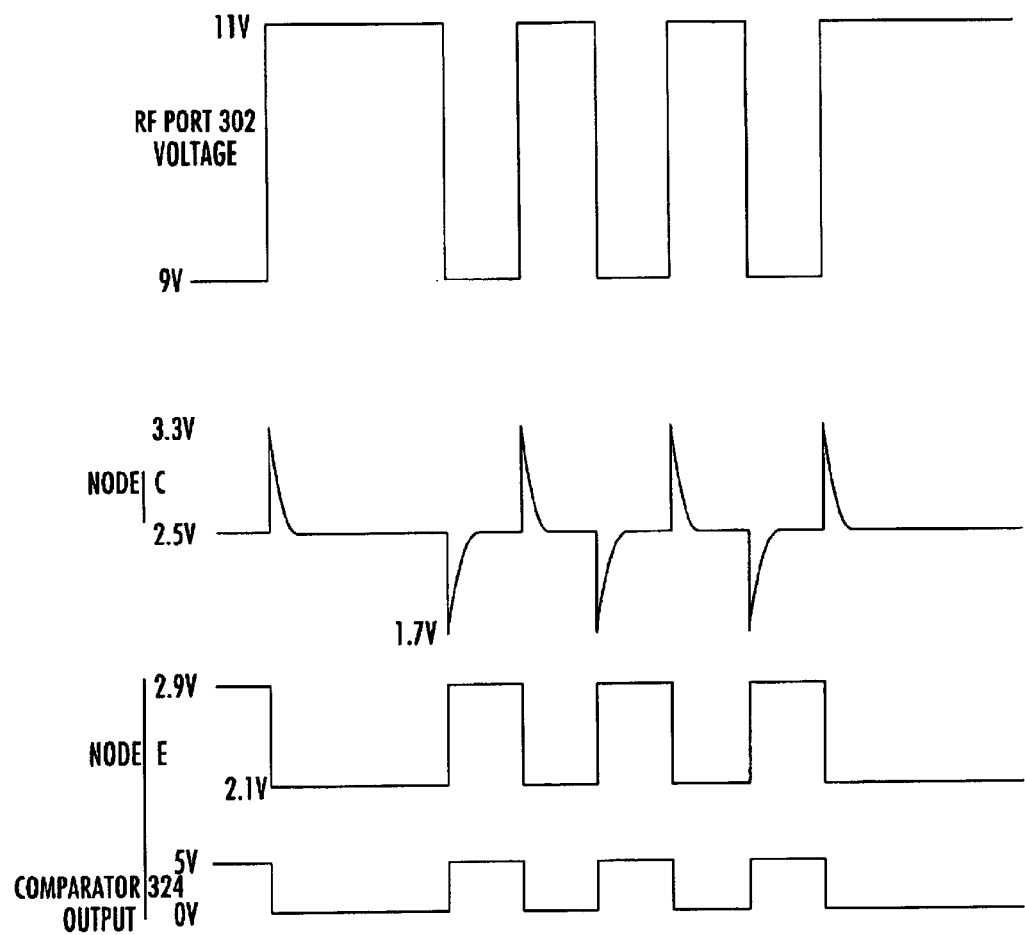
FIG. 6B is a waveform diagram depicted in conjunction with FIG. 6A.

The operation of pulse edge detector 322 and comparator 324 will now be discussed. Controller module 410 toggles the voltage on RF port 302 between 9V and 11V. The RF port's voltage waveform appears as a square wave, as shown in FIG. 6B. Resistor R19 and capacitor C15 form a differentiator. Current flows through R19 and C15 only during the transitions between 9V and 11V. The current decays to zero after the transition. Since Node C is nominally at 2.5V, which is set by the 5V source and resistors R20 and R21, the current flow through R19 and C15 will perturb Node C's voltage when the input signal transitions between 9V and 11V, as shown in FIG. 6B. Comparator 324 compares the voltage at Node C with the voltage at Node E. If the voltage on Node C is greater than the voltage on Node E, the output of comparator 324 changes to 0V. Thus, Node E's voltage sets the threshold voltage for the comparator to change state.

Comparator 324 has two thresholds set by resistors R23, R24 and R25 and the state of the comparator's output. When the comparator's output is 5V, the voltage on Node E equals 2.9V, and when the comparator's output is 0V, the voltage on Node E equals 2.1V. Having two thresholds reduces the chance of the comparator switching states due to noise on the input waveform. This is a common technique called "hysteresis." Diodes CR6 and CR7 act as limiters. They prevent Node C from rising above +5.3V or falling below −0.3V.

The waveforms depicted in FIG. 6B will now be discussed in more detail in conjunction with FIG. 6A. Initially, the voltage on RF port 302 is constant at 9V and Node C is at 2.5V. Assuming the output of comparator 324 to be 5V, Node E is at 2.9V. (Upon powering up calibration module 300, the output of comparator 324 maybe either 5V or 0V, but by applying an initialization pulse sequence, the comparator's output can be set to 5V before data transmission from the VNA 400 to calibration module 300). Next, the voltage on RF port 302 changes from 9V to 11V. This causes current to flow through R19 and C15 during the transition and perturbs Node C's voltage. Node C jumps from 2.5V to 3.3V and decays back to 2.5V as the current flow through R19 and C15 diminishes to zero. Since Node C's peak voltage (3.3V) is greater than Node E (2.9V), the comparator 324's output will change from 5V to 0V. After the comparator's output changes to 0V, the voltage on Node E will then become 2.1V. This sets the new threshold for comparator 324 to change its output state.

Next, the voltage on RF port 302 changes from 11V to 9V. Again, current flows through R19 and C15 during the transition and perturbs Node C's voltage. The direction of current flow causes Node C to jump from 2.5V to 1.7V. As current flow through R19 and C15 diminishes, Node C recovers to 2.5V. Since Node C's minimum voltage (1.7V) is less than Node E (2.1V), the output of comparator 324 will change from 0V to 5V.

Memory 326 depicted in FIG. 6A stores characterization data for the reflecting components. In one embodiment, memory 326 comprises Atmel part no. AT25256W-10SC-2.7. This characterization data is recalled and transmitted to VNA 400 under the direction of microcontroller 314, which, in turn, operates under the direction of control signals received from controller module 410. In one embodiment, microcontroller 314 comprises National Semiconductor part no. COP8SAA716M8P. The stored characterization data is transmitted to VNA 400 by varying the current on RF port 302. This varied current is generated by constant current source 332, which includes switch (transistor) Q8. Transistor Q8 is controlled by microcontroller 314.

As shown in FIG. 6A, calibration module 300 contains a temperature sensor 328. Because characterization data can be affected by temperature, temperature sensor 328 provides the ability to measure the temperature at the time the reflecting components are characterized. This temperature is stored in memory 326 for future reference. In one embodiment, temperature sensor 328 comprises Analog Devices part no. AD7814ART.

Controller Module

Figure 7:
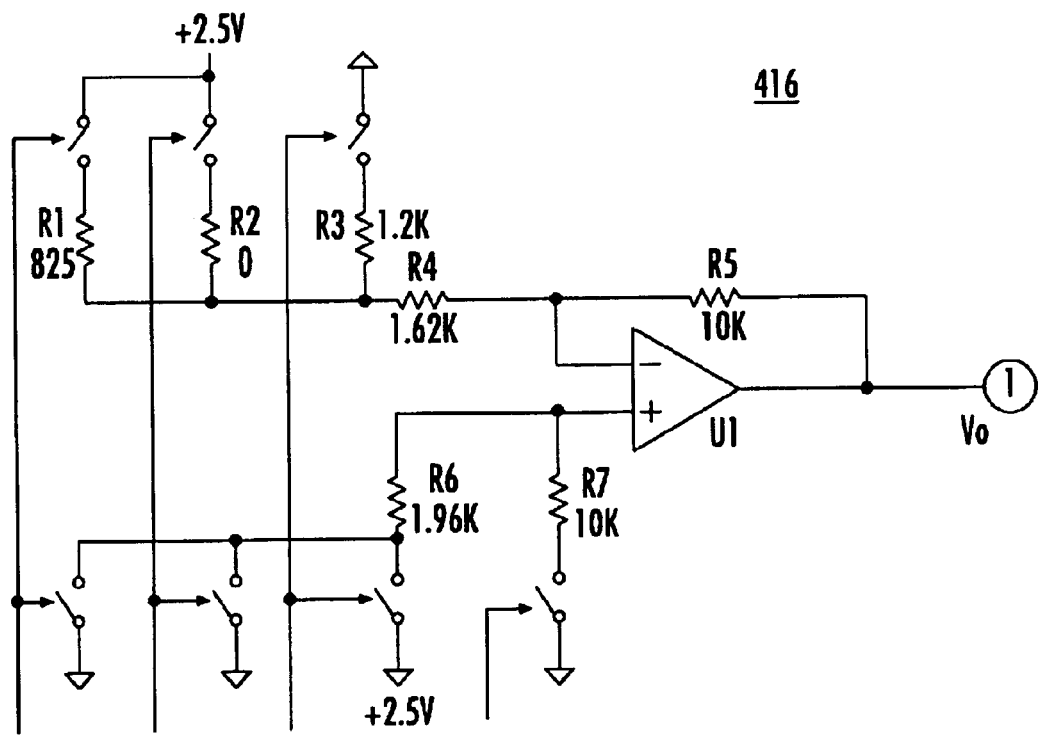
FIG. 7 is a schematic diagram of a portion of a controller module in accordance with the present invention.
Figure 8:
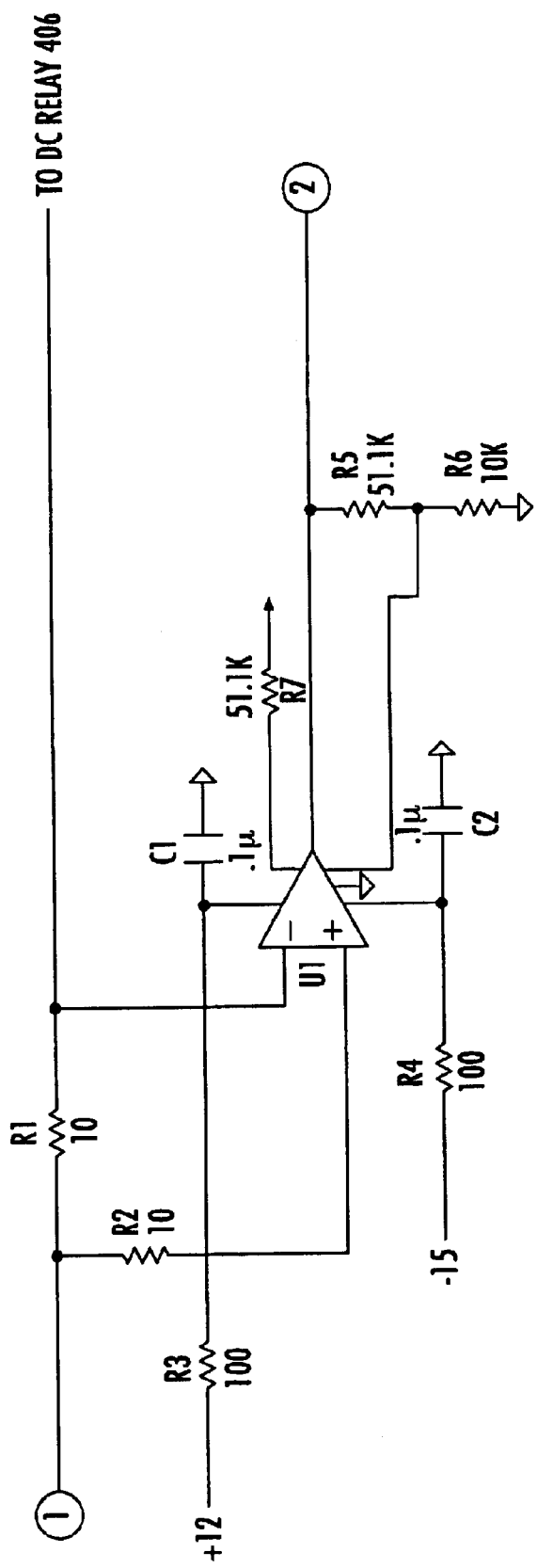
FIG. 8 is a schematic diagram of a portion of a controller module in accordance with the present invention.
Figure 9A:
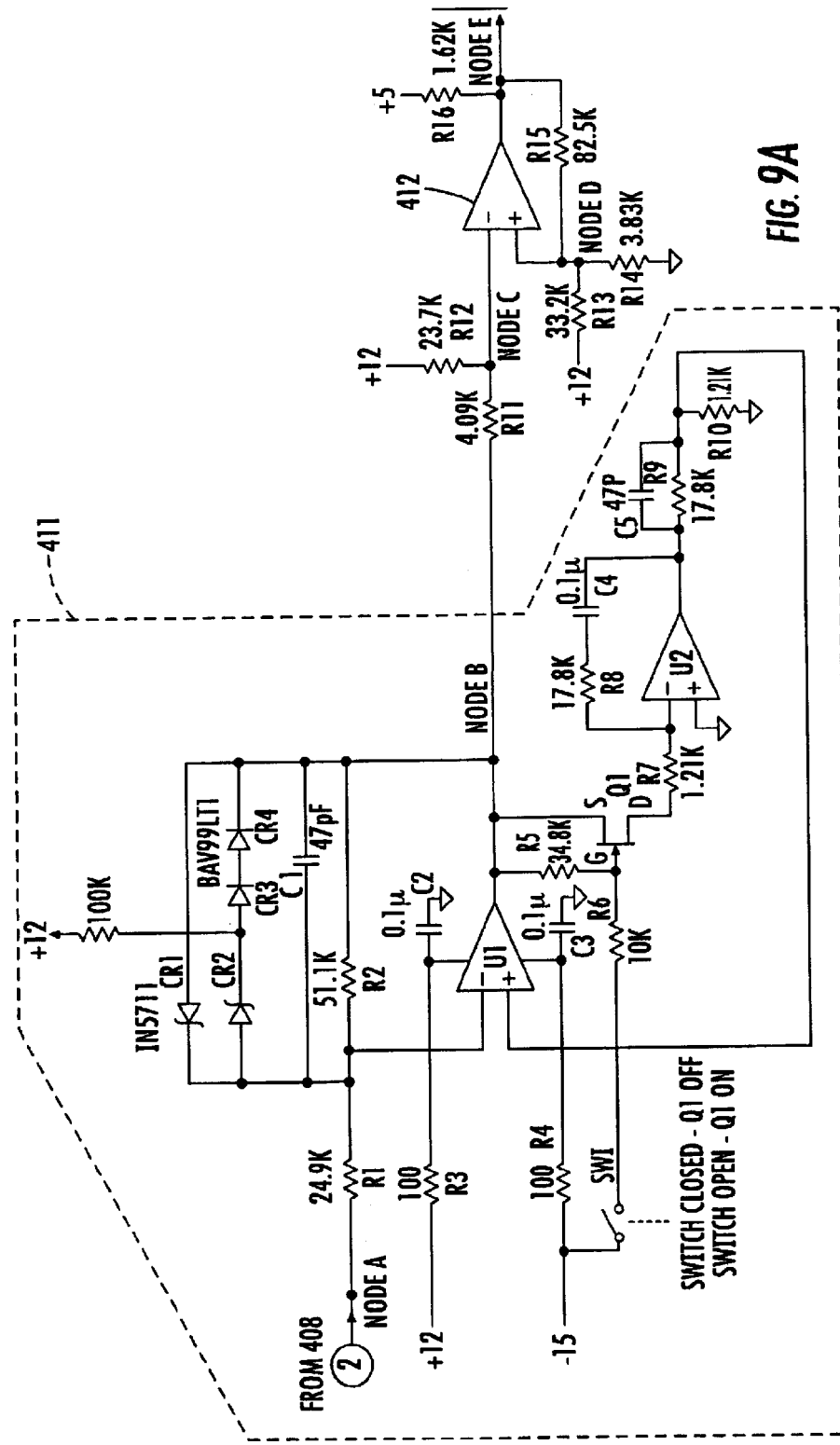
FIG. 9A is a schematic diagram of a portion of a controller module in accordance with the present invention.

Further details of controller 410 will now be discussed. FIGS. 7, 8 and 9A together provide a schematic diagram of one embodiment of controller module 410 in accordance with the present invention. FIG. 7 depicts voltage source 416, FIG. 8 depicts current to voltage convertor 408, and FIG. 9A depicts pulse shaper amplifier 411 and comparator 412. The figures are connected at points "1" and "2."

With reference to FIG. 7, voltage source 416 consists of an op-amp U1 that generates the four DC voltage levels sent as control signals to calibration module 300. In one embodiment, the four voltage levels that are generated are −10V, −15V, +9V and +11V. The desired voltage is selected by switching the right combination of resistors and voltages to the op-amp inputs.

With reference to FIG. 8, current to voltage convertor 408 measures the current drawn from calibration module 300 by measuring the voltage across resistor R1 (resistor 414 of FIG. 4). Instrumentation amplifier U1 then amplifies this voltage drop. In one embodiment, amplifier U1 comprises Texas Instruments part no. INA145UA. The output of current to voltage convertor 408 is fed into pulse shaper amplifier 411 and brought up to suitable DC values for input into comparator 412. Comparator 412 converts these voltage levels into logic level signals that can be used by VNA microprocessor 420.

Figure 9B:
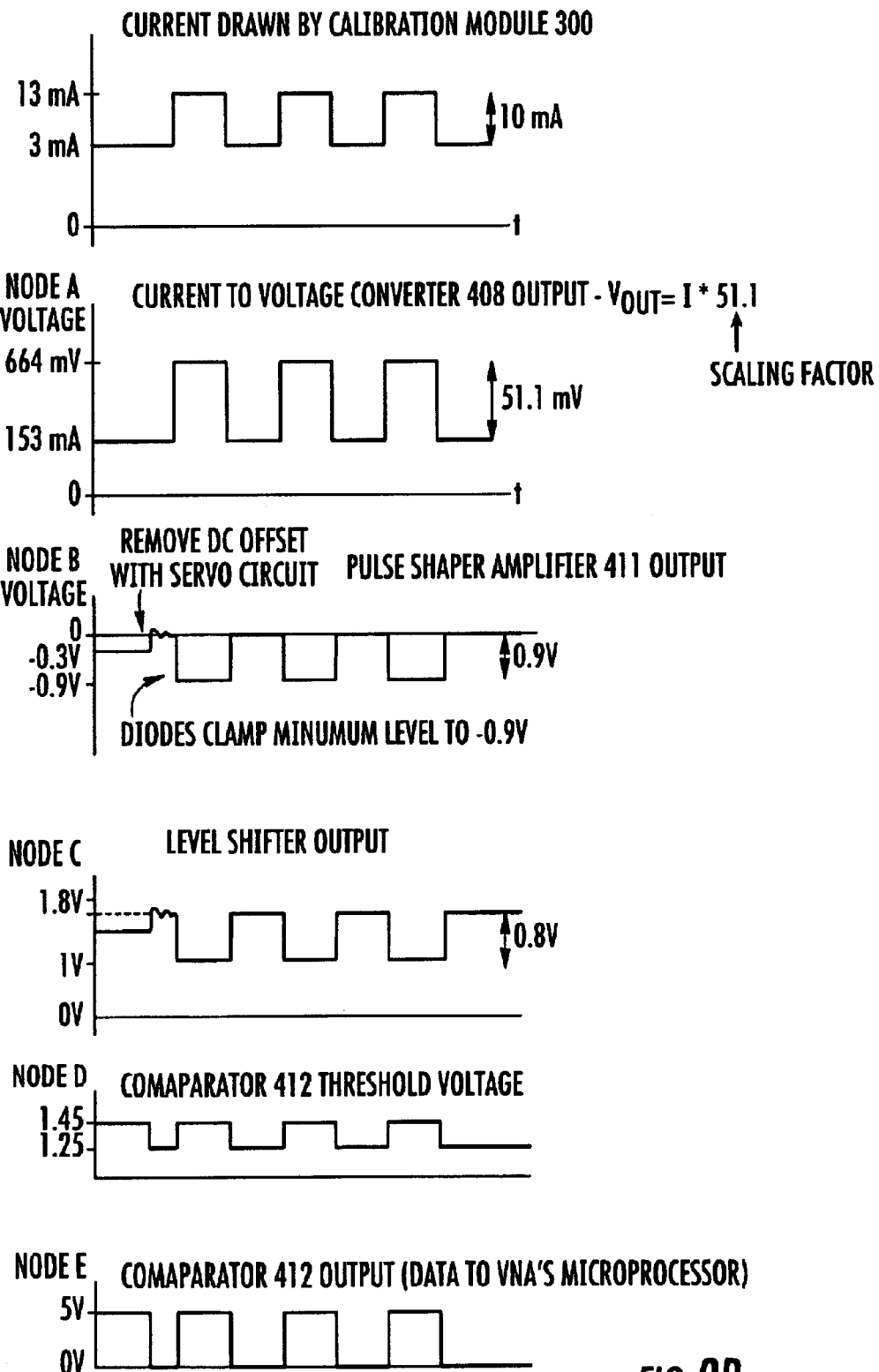
FIG. 9B is a waveform diagram depicted in conjunction with FIG. 9A.

Lastly, with reference to FIG. 9A and 9B, pulse shaper amplifier 411 comprises two sections: the amplifier built around U1 and a servo (or "zeroing") circuit built around U2. The calibration module 300 modulates the current to send data to controller module 410. In one embodiment, the current is toggled between 3 mA and 13 mA. Current to voltage converter 408 converts the current to a voltage signal. As shown in FIG. 9B, the voltage signal received in this embodiment from current to voltage converter 408 (at Node A) looks like a square wave with amplitude=511 mV and a DC offset=153 mV.

The signal on Node A is fed into amplifier U1, which has gain=(−R2/R1) =−2. Diodes CR2–CR4 limit the minimum output level=−0.9V and diode CR1 limits the maximum level=+0.5V. Since the input signal has a DC offset, U1 amplifies it causing the output to also have a DC offset. One way to remove the DC offset is to use a servo circuit that forces the DC offset at the output of U1 to be 0V. Q1 is a switch that connects U1's output to the input U2. U2 acts as an integrator. U2's output is scaled down by R9 and R10 and connected to the positive input of U1. The circuit monitors U1's output level and sends a correction voltage to U1's positive input, causing the output of U1 to be 0V. The servo's input needs to be disconnected from U1's output after its output has been "zeroed." Otherwise, U1 remains at 0V even when there is a square wave at Node A. Once disconnected, the servo circuit can still hold U1's output to 0V until node A's voltage changes. When receiving data from the calibration module 300, U1's output (after being zeroed) appears as a square wave toggling between 0V and −0.9V. Resistors R11 and R12 serve as a level shifter and shift U1's output to 1V and 1.8V. See FIG. 9B. This signal is then connected to the input of comparator 412. Comparator 412 has threshold voltages of 1.25V and 1.45V. The thresholds are set by resistors R13, R14, R15, R16, and the state of the comparator's output.

The foregoing detailed description of the invention has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for use in calibrating a Vector Network Analyzer (VNA) using only a single connection between the apparatus and the VNA that is being calibrated, the apparatus comprising:
   a single port through which both control signals and RE/microwave stimulus signals are received from a VNA that is being calibrated;
   a set of reflecting components switchably connectable to the single port;
   a microcontroller operatively coupled to the single port;
   wherein the microcontroller is controllable by the control signals received through the single port from a VNA that is being calibrated; and
   wherein the microcontroller controls the transmission of further signals through the single port to a VNA that is being calibrated.

2. The apparatus of claim 1, further comprising a memory operatively coupled to the single port and the microcontroller, wherein the memory stores a set of known scattering parameters for the set of reflecting components.

3. The apparatus of claim 2, further comprising a power regulator operatively coupled to the single port and the microcontroller and the memory.

4. The apparatus of claim 1, wherein the set of reflection components comprises a short, an open and a low reflection impedance.

5. The apparatus of claim 1, wherein the further signals transmitted from the microcontroller to a VNA being calibrated include characterization data for the set of reflecting components.

6. An apparatus for use in calibrating a Vector Network Analyzer (VNA), the apparatus comprising:
a port;
a set of reflecting components switchably connectable to the port;
a microcontroller operatively coupled to the port;
a pulse edge detector operatively coupled to the port; and
a comparator operatively coupled to the pulse edge detector and the microcontroller;
wherein the microcontroller is controllable by signals received through the port from a VNA that is being calibrated;
wherein the microcontroller controls the transmission of signals through the port to a VNA that is being calibrated;
wherein the pulse edge detector senses pulse edges of control signals received through the port from a VNA that is being calibrated; and
wherein the comparator converts the pulse edges detected by the pulse edge detector to logic levels that can control the microcontroller.

7. The apparatus of claim 6, wherein the control signals comprise at least two voltage levels.

8. The apparatus of claim 6, further comprising a switch assembly coupled between the port and the set of reflecting components, the switch assembly adapted to connect a selected one of the short, the open and the low reflection impedance to the port.

9. The apparatus of claim 6, wherein the apparatus is adapted to be connected, to a VNA being calibrated, by a single cable that is connected between the port of the apparatus and a single port of the VNA being calibrated, without any further cables being connected between the apparatus and the VNA being calibrated.

10. An apparatus for use in calibrating a Vector Network Analyzer (VNA), the apparatus comprising:
a port;
a set of reflecting components switchably connectable to the port;
a microcontroller operatively coupled to the port;
wherein the microcontroller is controllable by signals received through the port from a VNA that is being calibrated;
wherein the microcontroller controls the transmission of signals through the port to a VNA that is being calibrated; and
wherein the set of reflection components comprises a short, an open and a low reflection impedance.

11. The apparatus of claim 10, further comprising a switch assembly coupled between the port and the set of reflecting components, the switch assembly adapted to connect a selected one of the short, the open and the low reflection impedance to the port.

12. The apparatus of claim 10, wherein the apparatus is adapted to be connected, to a VNA being calibrated, by a single cable that is connected between the port of the apparatus and a single port of the VNA being calibrated, without any further cables being connected between the apparatus and the VNA being calibrated.

13. The apparatus of claim 10, further comprising a switch assembly coupled between the port and the set of reflecting components, the switch assembly adapted to connect a selected one of the short, the open and the low reflection impedance to the port.

14. The apparatus of claim 10, wherein the apparatus is adapted to be connected, to a VNA being calibrated, by a single cable that is connected between the port of the apparatus and a single port of the VNA being calibrated, without any further cables being connected between the apparatus and the VNA being calibrated.

15. An apparatus for use in calibrating a Vector Network Analyzer (VNA) using only a single connection between the apparatus and the VNA that is being calibrated, the apparatus comprising:
a single port through which both control signals and RF/microwave stimulus signals are transmitted;
a set of reflecting components providing a set of known scattering parameters;
a switch having a first end operatively coupled to the single port and a second end selectively connectable to individual ones of the set of reflection components, wherein the switch is controlled by a first set of the control signals received through the single port; and
a microcontroller operatively coupled to the single port, wherein the microcontroller is controlled by a second set of the control signals received through the single port.

16. The apparatus of claim 15, further comprising a memory operatively coupled to the single port and the microcontroller, wherein the memory stores the set of known scattering parameters.

17. The apparatus of claim 16, further comprising a power regulator operatively coupled to the single port and the microcontroller and the memory.

18. The apparatus of claim 15, wherein the first set of control signals comprises at least three voltage levels.

19. The apparatus of claim 15, wherein the second set of control signals comprises at least two voltage levels.

20. The apparatus of claim 15, further comprising a current source operatively coupled to the microcontroller and the single port, wherein the current source provides current pulses through the port under direction of the microcontroller.

21. The apparatus of claim 15, further comprising:
a memory operatively coupled to the single port and the microcontroller, wherein the memory stores the set of known scattering parameters; and
a power regulator operatively coupled to the single port and the microcontroller and the memory.

22. The apparatus of claim 15, further comprising:
a voltage sensor operatively coupled to the single port and the switch, wherein the voltage sensor is configured for receiving the first set of control signals and for controlling the operation of the switch.

23. An apparatus for use in calibrating a Vector Network Analyzer (VNA), the apparatus comprising:
a single port;
a set of reflecting components providing a set of known scattering parameters;
a switch having a first end operatively coupled to the single port and a second end selectively connectable to individual ones of the set of reflection components, wherein the switch is controlled by a first set of control signals received through the single port;
a microcontroller operatively coupled to the single port, wherein the microcontroller is controlled by a second set of control signals received through the single port; and a voltage sensor operatively coupled to the single port and the switch, wherein the voltage sensor is configured for receiving the first set of control signals through the single port and for controlling the operation of the switch.

24. An apparatus for use in calibrating a Vector Network Analyzer (VNA), the apparatus comprising:
a port;
a set of reflecting components providing a set of known scattering parameters;
a switch having a first end operatively coupled to the port and a second end selectively connectable to individual ones of the set of reflection components, wherein the switch is controlled by a fist set of control signals received through the port; and
a microcontroller operatively coupled to the port, wherein the microcontroller is controlled by a second set of control signals received through the port;
wherein the set of reflection components comprises a short, an open and a low reflection impedance.

25. A method for providing to a Vector Network Analyzer (VNA) a set of known scattering parameters for a set of reflecting components, the method comprising the steps of:
providing a calibration apparatus for use in calibrating a VNA using only a single connection between the apparatus and the VNA, the calibration apparatus including a single port; providing, within the calibration apparatus, a memory for storing the set of known scattering parameters;
providing, within the calibration apparatus, a microcontroller operatively coupled to the single port and to the memory;
providing, within the calibration apparatus, a current source operatively coupled to the single port and to the microcontroller; and
providing a the VNA with the set of known scattering parameters by transmitting current pulses that are indicative of the set of known scattering parameters, from the current source through the single port to the VNA under direction of the microcontroller.

26. An apparatus for use in calibrating a Vector Network Analyzer (VNA), the apparatus comprising:
a port;
a set of reflecting components providing a set of known scattering parameters;
a switch having a first end operatively coupled to the port and a second end selectively connectable to individual ones of the set of reflection components, wherein the switch is controlled by a first set of control signals received through the port;
a microcontroller operatively coupled to the port, wherein the microcontroller is controlled by a second set of control signals received through the port;
a memory operatively coupled to the port and the microcontroller, wherein the memory stores the set of known scattering parameters; and
a power regulator operatively coupled to the port and the microcontroller and the memory;
wherein the power regulator uses signals received through the port, from a VNA being calibrated, to produce a voltage that powers the microcontroller and the memory.

27. An apparatus for use in calibrating a Vector Network Analyzer (VNA) using only a single connection between the apparatus and the VNA that is being calibrated, the apparatus comprising:
a single port;
a set of reflecting components switchably connectable to the single port;
a microcontroller operatively coupled to the single port;
a pulse edge detector operatively coupled to the single port; and
a comparator operatively coupled to the pulse edge detector and the microcontroller;
wherein the microcontroller is controllable by signals received through the single port from a VNA that is being calibrated;
wherein the microcontroller controls the transmission of signals through the single port to a VNA that is being calibrated;
wherein the pulse edge detector senses pulse edges of control signals received through the single port from a VNA that is being calibrated; and
wherein the comparator converts the pulse edges detected by the pulse edge detector to logic levels that can control the microcontroller.

28. The apparatus of claim 27, wherein the control signals comprise at least two voltage levels.

29. An apparatus for use in calibrating a Vector Network Analyzer (VNA) using only a single connection between the apparatus and the VNA that is being calibrated, the apparatus comprising:
a single port;
a set of reflecting components providing a set of known scattering parameters;
a switch having a first end operatively coupled to the single port and a second end selectively connectable to individual ones of the set of reflection components, wherein the switch is controlled by a first set of control signals received through the single port;
a microcontroller operatively coupled to the single port, wherein the microcontroller is controlled by a second set of control signals received through the single port;
a memory operatively coupled to the single port and the microcontroller, wherein the memory stores the set of known scattering parameters; and
a power regulator operatively coupled to the single port and the microcontroller and the memory;
wherein the power regulator uses signals received through the single port, from a VNA being calibrated, to produce a voltage that powers the microcontroller and the memory.

30. An apparatus for use in calibrating a Vector Network Analyzer (VNA) using only a single connection between the apparatus and the VNA that is being calibrated, the apparatus comprising:
a single port through which both control signals and RF/microwave stimulus signals are received from a VNA that is being calibrated; and
a set of reflecting components switchably connectable to the single port;
wherein controls signals received through the single port control which one of the reflecting components is connected to the single port; and
wherein RE/microwave stimulus signals received through the single port are incident upon the reflecting component connected to the single port at the time the stimulus signals are received.

* * * * *

UNITED STATES PATENT AND TRADEMARK OFFICE
CERTIFICATE OF CORRECTION

PATENT NO. : 6,917,892 B2
DATED : July 12, 2005
INVENTOR(S) : Donald Anthony Bradley et al.

It is certified that error appears in the above-identified patent and that said Letters Patent is hereby corrected as shown below:

Column 8,
Line 47, replace "RE" with -- RF --; and

Column 10,
Line 15, replace "RE" with -- RF --.

Signed and Sealed this

Eleventh Day of October, 2005

JON W. DUDAS
*Director of the United States Patent and Trademark Office*